(12) United States Patent
Fort et al.

(10) Patent No.: US 8,471,636 B2
(45) Date of Patent: Jun. 25, 2013

(54) DIFFERENTIAL PAIR WITH CONSTANT OFFSET

(75) Inventors: Jimmy Fort, Aix en Provence (FR); Thierry Soude, Marseilles (FR); Michel Cuenca, Septemes-les-Vallons (FR); Florent Garcia, Fuveau (FR); Franck Strazzieri, Auriol (FR)

(73) Assignee: Atmel Rousset S.A.S., Rousset Cedez (FR)

( * ) Notice: Subject to any disclaimer, the term of this patent is extended or adjusted under 35 U.S.C. 154(b) by 0 days.

(21) Appl. No.: 13/414,145

(22) Filed: Mar. 7, 2012

(65) Prior Publication Data

US 2012/0161873 A1 Jun. 28, 2012

Related U.S. Application Data

(62) Division of application No. 12/620,351, filed on Nov. 17, 2009, now Pat. No. 8,183,922.

(51) Int. Cl.
*H03F 3/45* (2006.01)

(52) U.S. Cl.
USPC .......................................... 330/261; 330/254

(58) Field of Classification Search
USPC ...................... 330/9, 253, 254, 261
See application file for complete search history.

(56) References Cited

U.S. PATENT DOCUMENTS

| | | | | |
|---|---|---|---|---|
| 4,430,624 A | * | 2/1984 | Newton | 330/288 |
| 5,359,296 A | * | 10/1994 | Brooks et al. | 330/288 |
| 5,594,383 A | | 1/1997 | Tamba | |
| 5,793,254 A | * | 8/1998 | O'Connor | 330/282 |
| 6,191,656 B1 | * | 2/2001 | Nadler | 330/288 |
| 6,252,458 B1 | * | 6/2001 | Shibata | 330/261 |
| 6,369,652 B1 | | 4/2002 | Nguyen et al. | |
| 6,606,001 B1 | * | 8/2003 | Ziazadeh et al. | 330/288 |
| 7,170,349 B2 | | 1/2007 | Bhattacharjee et al. | |
| 7,224,224 B2 | * | 5/2007 | Sera et al. | 330/253 |
| 7,256,651 B1 | | 8/2007 | Ziazadeh et al. | |
| 7,301,391 B2 | | 11/2007 | Jaussi et al. | |
| 7,312,660 B2 | | 12/2007 | Koh et al. | |
| 7,400,203 B2 | | 7/2008 | Ojo et al. | |
| 7,501,892 B2 | | 3/2009 | Otaka et al. | |
| 7,525,381 B2 | | 4/2009 | Murden et al. | |
| 7,755,427 B2 | | 7/2010 | Chen | |
| 7,843,264 B2 | | 11/2010 | Davierwalla et al. | |

* cited by examiner

*Primary Examiner* — Henry Choe
(74) *Attorney, Agent, or Firm* — Fish & Richardson P.C.

(57) ABSTRACT

A bias current is generated for an unbalanced differential pair that is proportional to the transconductance gain of the differential pair. When the transconductance gain varies (e.g., due to temperature variations), the bias varies in proportion thereby maintaining a constant offset voltage. In some implementations, a voltage to current converter circuit generates the bias current from a constant reference voltage that is independent of temperature and voltage supply variations (e.g., a bandgap reference voltage).

10 Claims, 3 Drawing Sheets

DIFFERENTIAL PAIR WITH CONSTANT OFFSET

CROSS-REFERENCE TO RELATED APPLICATIONS

This application is a divisional and claims the benefit and priority of U.S. Ser. No. 12/620,351 filed on Nov. 17, 2009, the entire contents of which are hereby incorporated herein by reference.

TECHNICAL FIELD

This subject matter is generally related to electronics, and more particularly to compensating variations in unbalanced differential pairs.

BACKGROUND

An ideal operational amplifier amplifies the difference in voltages applied to its two input terminals. If the input voltages are equal, then the ideal output voltage of the amplifier is zero. In practical operational amplifiers, however, the output is often not zero due to an unbalanced differential pair in the operational amplifier. This non-zero output can be modeled as an offset voltage. If the offset voltage is constant over the operational range of the amplifier then compensation can be accomplished using another voltage of the same magnitude and opposite polarity. The offset voltage, however, depends on transconductance gain of the differential pair, and the transconductance gain can vary with changes in temperature. This can result in an offset voltage that is not constant.

SUMMARY

A bias current is generated for an unbalanced differential pair that is proportional to the transconductance gain of the differential pair. When the transconductance gain varies (e.g., due to temperature variations), the bias current varies in proportion thereby maintaining a constant offset voltage. In some implementations, a voltage to current converter circuit generates the bias current from a constant reference voltage that is independent of temperature and voltage supply variations (e.g., a bandgap reference voltage).

The disclosed implementations provide a fully integrated solution for a constant offset comparator, which can be manufactured at low cost, and which can potentially work at a low voltage supply (e.g., 1.2 volts).

DETAILED DESCRIPTION

Figure 1:
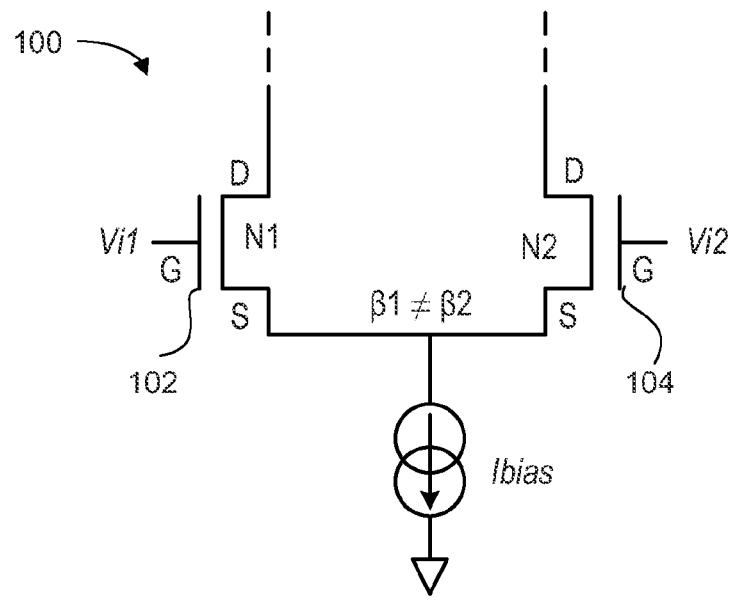
FIG. 1 is a schematic diagram of an example unbalanced differential pair.

FIG. 1 is a schematic diagram of an example unbalanced differential pair 100. In some implementations the differential pair 100 includes a pair of metal-oxide-semiconductor field-effect transistor (MOSFET) transistors 102, 104 (N1, N2) having their source terminals connected to a bias current source (Ibias). In the example shown, the transistors 102, 104 are n-channel MOSFET transistors.

The gate terminals of the transistors 102, 104 are connected to input voltages Vi1, Vi2, which can be the non-inverting and inverting inputs, respectively, of an operational amplifier. The transistors 102, 104 have transconductance gains $\beta 1$ and $\beta 2$, respectively. The transconductance gains are not equal ($\beta 1 \neq \beta 1$) in the unbalanced differential pair 100, resulting in a non-zero output voltage.

The transconductance gain $\beta$ of a transistor is given by the relation below:

$$\beta = \kappa \cdot \frac{W}{L}, \quad [1]$$

where $\kappa$ is a transconductance parameter, W is the channel width and L is the channel length of the transistor.

The offset of the differential pair 100 is given by the relation below:

$$os = \Delta V_{gs} = \sqrt{\frac{2Ibias}{\beta_1}} + V_t - \sqrt{\frac{2Ibias}{\beta_2}} - V_t, \quad [2]$$

where $\Delta V_{gs}$, is the difference between the gate-to-source voltages of the NMOSFET transistors 102, 104, $V_t$ is a threshold voltage of the NMOSFET transistors 102, 104 and $\beta 1, \beta 2$, are the transconductance gains of NMOSFET transistors 102, 104. The offset voltage, os, of [2] may not always be constant because transconductance gains $\beta 1, \beta 2$ can vary as a function of temperature. To obtain a constant offset voltage, os, the bias current Ibias should be proportional to the transconductance $\beta$ of the differential pair. For a NMOSFET transistor, Ibias is given by the relations $$Ibias = \frac{\beta}{2} \cdot (V_{gs} - V_t)^2.$$

To make this current only proportional to $\beta$, a $V_{gs}$ equals to Vbg+Vt is imposed $$Ibias = \frac{\beta}{2} \cdot (V_{bg} + V_t - V_t)^2 = \frac{\beta}{2} \cdot V_{bg}^2 \quad [3]$$

For example, assuming that $$\beta 2 = K \cdot \beta 1 = \beta, \quad [4]$$

Combining [3], [4] and [2] gives, $$os = \Delta Vgs = V_{bg} \cdot (\sqrt{\sqrt{K}} - 1) = \text{const}. \quad [5]$$

As can be observed from [5], os is a function of a constant bandgap voltage, Vbg, and K, where K is a ratio of $\beta 2$ to $\beta 1$ and is also constant. Thus, as temperature varies, Vbg and K remain substantially constant, resulting in the offset voltage remaining substantially constant.

Figure 2:
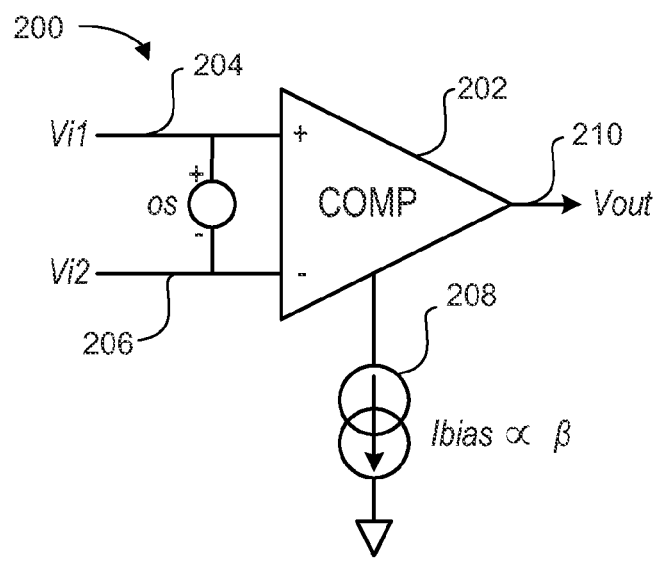
FIG. 2 illustrates an example compensation technique using bias current.

FIG. 2 illustrates an example compensation technique using bias current. An operational amplifier 200 includes non-inverting and inverting input terminals 204, 206 for receiving input voltages Vi1, Vi2, respectively. The output terminal 210 of the operational amplifier 200, provides a voltage output, Vout, which is often non-zero. This non-zero voltage output can be modeled as an offset voltage placed across the input terminals 204, 206. To maintain a constant offset voltage os, a bias current source 208 (Ibias), should be proportional to the transconductance gain, β.

Figure 3:
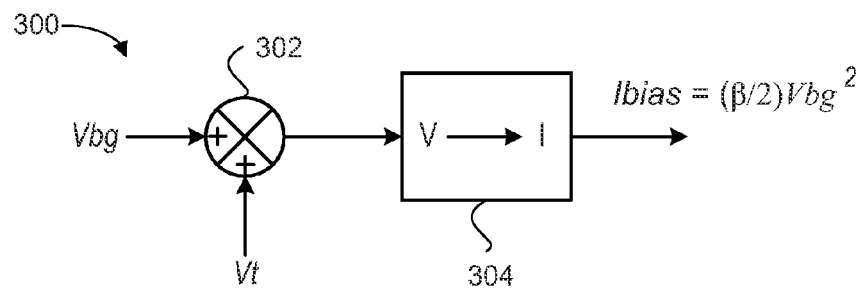
FIG. 3 illustrates a principal of bias current generation.

FIG. 3 is a block diagram illustrating a process 300 of bias current generation for compensating an unbalanced differential pair. In some implementations, a process 300 can include summing a bandgap voltage or other constant voltage and a threshold voltage of a transistor device (302) and converting the resulting voltage into a bias current (304). The resulting bias current is given by $$Ibias = \frac{\beta}{2} \cdot V_{bg}^2, \quad [6]$$

where β is the transconductance gain and Vbg is the bandgap voltage. As can be observed from [3], the Ibias is only proportional to β because the square of bandgap voltage is constant. The generation of Ibias is described below in reference to FIG. 4.

Figure 4:
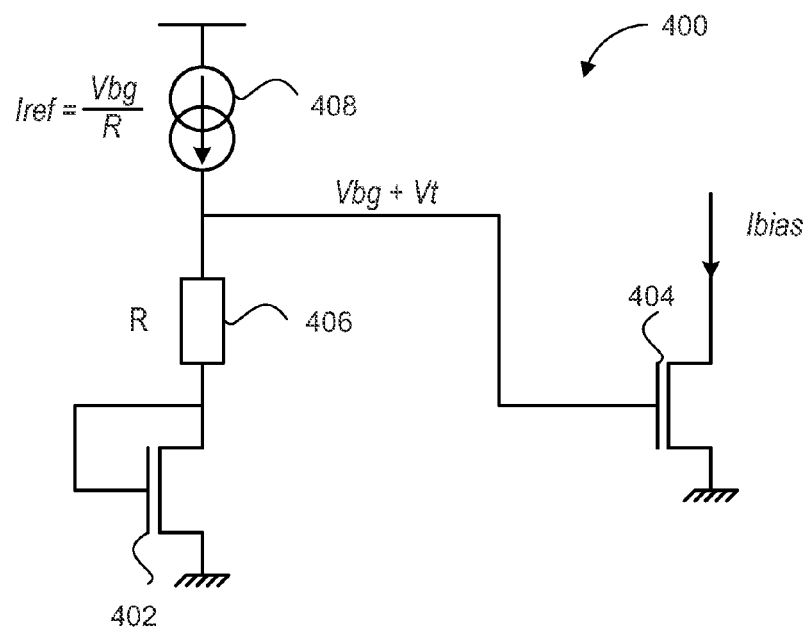
FIG. 4 is a schematic diagram of an example circuit for generating a bias current for compensating variations in an unbalanced differential pair.

FIG. 4 is a schematic diagram of an example circuit 400 for generating a bias current, Ibias, for compensating variations in an unbalanced differential pair (e.g., differential pair 100). This figure shows how to generate Vbg+Vt on the gate of the transistor 404. The transistor 402 operates in saturation region. In the example shown, a bandgap reference voltage, Vbg, is used. Circuits for generating bandgap reference voltages that are independent of voltage supply variations and temperature variations are known in the art and will not be described here.

When Vdg=0 for transistor 402, for example by connecting the drain and gate terminals of the transistor 402 together as shown, then, Id, in the transistor 402 is a function of Vgs, and Iref sets the value of Vgs. The transistor 402 is sized to give Vgs=Vt. So, the gate of the transistor 404 is equal to $$Vt + R \cdot Iref = V_t + R \cdot \frac{V_{bg}}{R} = Vt + V_{bg}.$$

Since $$Ibias = \frac{\beta}{2} \cdot V_{bg}^2$$

and Vbg is constant, the circuit 400 generates a bias current, Ibias, that is proportional to β.

The example circuit 400 includes an example reference voltage supply circuit. The reference voltage supply circuit can comprise, for example, a first MOSFET transistor 402 having a gate terminal, a drain terminal and a source terminal, where the drain terminal and gate terminal are configured to have a drain-to-gate voltage of zero; and a resistive element 406 having a first end coupled to the drain terminal of the first MOSFET transistor 402 and a second end coupled to a reference current source 408, where the resistive element 406 and the reference current source 408 generate a reference voltage supply. The reference voltage supply can be, for example, equal to the sum of a bandgap voltage and a threshold voltage of the first MOSFET transistor 402. The reference voltage supply circuit can comprise, in another example, a first MOSFET transistor 402 having a gate terminal, a drain terminal and a source terminal, where the drain terminal and gate terminal are configured to have a drain-to-gate voltage of zero; and a reference current source 408 coupled to the drain terminal of the first MOSFET transistor 402, where the reference current source 408 includes a threshold-referenced or self-biased current source.

The example circuit 400 includes an example converter circuit coupled to the example reference voltage supply, the converter circuit operable for generating the bias current from a reference voltage supply generated by the reference voltage supply circuit. The converter circuit can comprise, for example, a second MOSFET transistor 404 having a gate terminal, a drain terminal and a source terminal, where the gate terminal is coupled to the reference supply voltage, the source terminal is coupled to ground voltage, and the drain terminal is coupled to the third terminals of the third terminals of transistors of a differential pair (e.g., as shown in FIG. 1 or FIG. 2.)

Figure 5:
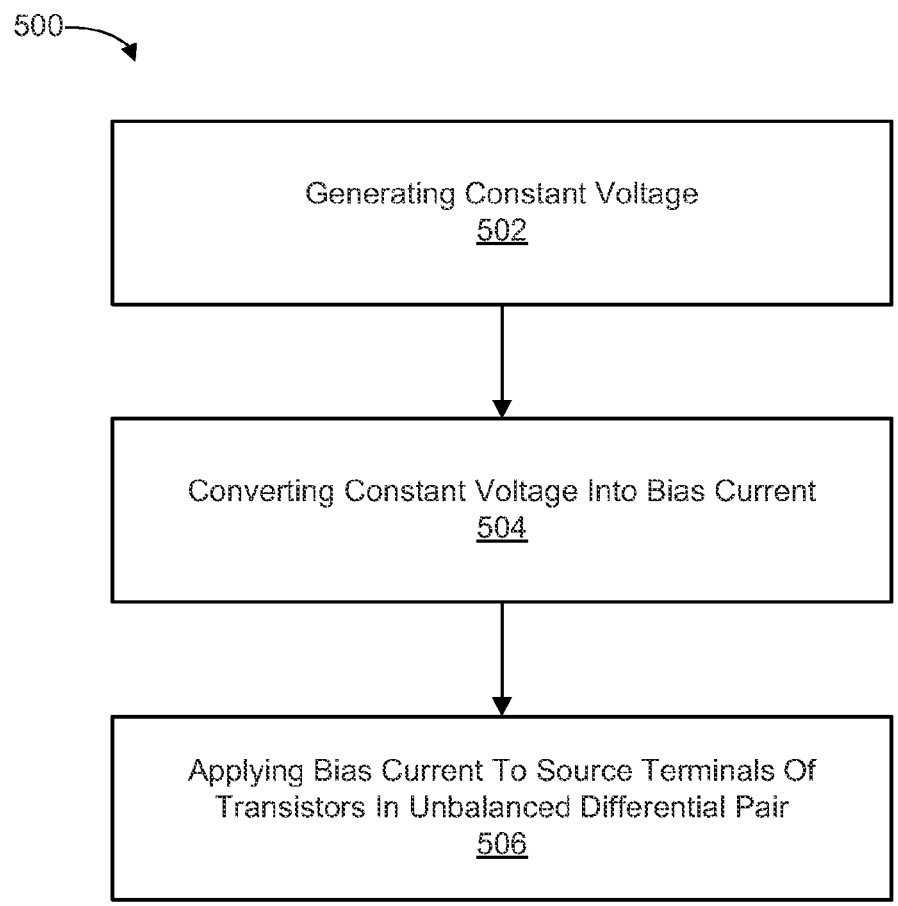
FIG. 5 is a flow diagram of a process for compensating variations in an unbalanced differential pair.

FIG. 5 is a flow diagram of a process 500 for compensating variations in an unbalanced differential pair. The process 500 can be performed using the circuits described in reference to FIGS. 1-4. In some implementations, the process 500 can include generating a constant reference voltage (502). For example, a bandgap reference voltage can be used. Generally, any circuit that can generate a reference voltage that is independent of voltage supply variations and temperature variations can be used. The constant voltage is converted to a current (504). The bias current is applied to the source terminals of the transistors of an unbalanced differential pair (506). The bias current is proportional to the transconductance gains of the transistors of the differential pair. If the transconductance gains vary due to temperature, the bias current varies in proportion resulting in a constant offset voltage. The compensations differential pair can be included in another circuit or device, such as an operational amplifier, as shown in FIG. 2.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. A method of compensating offset in an operational amplifier, comprising:
    generating, using the operational amplifier, an output signal;
    generating a reference voltage by a reference voltage supply circuit;
    converting, by a converter circuit coupled to the reference voltage supply circuit, the reference voltage into a bias current that varies in proportion to variations in transconductance gain of an unbalanced differential pair of transistors in the operational amplifier, a first terminal of each transistor coupled to an input voltage, a second terminal of each transistor coupled to a load, and a third terminal of each transistor coupled to the converter circuit; and applying the bias current to the third terminals of the unbalanced differential pair in the operational amplifier, thereby suppressing variations in the output signal caused by the variations in the transconductance gain.

2. The method of claim 1, where the transistors are MOSFET transistors and the first, second and third terminals are gate, drain and source terminals, respectively.

3. The method of claim 2, where the reference voltage supply circuit comprises:
   a first MOSFET transistor having a gate terminal, a drain terminal and a source terminal, where the drain terminal and gate terminal are configured to have a drain-to-gate voltage of zero; and
   a reference current source of the voltage supply circuit coupled to the drain terminal of the first MOSFET transistor, where the reference current source includes a threshold-referenced or self-biased current source.

4. The method of claim 2, where the reference voltage supply circuit comprises:
   a first MOSFET transistor having a gate terminal, a drain terminal and a source terminal, where the drain terminal and gate terminal are configured to have a drain-to-gate voltage of zero; and
   a resistive element having a first end coupled to the drain terminal of the first MOSFET transistor and a second end coupled to a reference current source, where the resistive element and the reference current source generate a reference voltage supply.

5. The method of claim 3, where the reference voltage is equal to the sum of a bandgap voltage and a threshold voltage of the first MOSFET transistor.

6. The method of claim 3, wherein generating the reference voltage comprises summing a bandgap voltage of the first MOSFET transistor with a threshold voltage of the first MOSFET transistor.

7. The method of claim 3, further comprising generating, by the reference current source, a constant current equal to a bandgap voltage of the first MOSFET transistor divided by a resistance of the resistive element.

8. The method of claim 3, where the converter circuit comprises:
   a second MOSFET transistor having a gate terminal, a drain terminal and a source terminal, where the gate terminal is coupled to the reference supply voltage, the source terminal is coupled to ground voltage, and the drain terminal is coupled to the third terminals of the transistors of the differential pair.

9. The method of claim 1, where generating the reference voltage includes generating the reference voltage to be substantially constant.

10. The method of claim 1, where converting the reference voltage into the bias current comprises generating the bias current so that the bias current varies in proportion to variations in transconductance gain resulting from temperature variations of the operational amplifier.

* * * * *

UNITED STATES PATENT AND TRADEMARK OFFICE
CERTIFICATE OF CORRECTION

PATENT NO. : 8,471,636 B2  
APPLICATION NO. : 13/414145  
DATED : June 25, 2013  
INVENTOR(S) : Jimmy Fort Page 1 of 1

It is certified that error appears in the above-identified patent and that said Letters Patent is hereby corrected as shown below:

Title Page Item [75], delete "Marseilles" and insert --Marseille--, therefor.

In the Specification

In Column 2, Line 10, delete "$\beta1$" and insert --$\beta2$--, therefor.

In Column 2, Line 57, delete "$\sqrt{}\sqrt{K-1}$)" and insert --($\sqrt{K-1}$)--.

In Column 3, Line 33, delete "Vdg" and insert --Vbg--, therefor.

Signed and Sealed this  
Twenty-fourth Day of September, 2013

Teresa Stanek Rea  
*Deputy Director of the United States Patent and Trademark Office*